(12) United States Patent
Takahashi et al.

(10) Patent No.: US 11,840,759 B2
(45) Date of Patent: Dec. 12, 2023

(54) METHOD OF FORMING TUNGSTEN FILM AND SYSTEM THEREFOR

(71) Applicant: Tokyo Electron Limited, Tokyo (JP)

(72) Inventors: Masafumi Takahashi, Nirasaki (JP); Kenji Suzuki, Nirasaki (JP); Tsuyoshi Takahashi, Nirasaki (JP); Masaki Sano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/653,690

(22) Filed: Mar. 7, 2022

(65) Prior Publication Data

US 2022/0290294 A1    Sep. 15, 2022

(30) Foreign Application Priority Data

Mar. 9, 2021   (JP) .................. 2021-037737

(51) Int. Cl.
  *C23C 16/02*   (2006.01)
  *C23C 16/455*  (2006.01)
  *C23C 16/14*   (2006.01)

(52) U.S. Cl.
  CPC .......... *C23C 16/0272* (2013.01); *C23C 16/14* (2013.01); *C23C 16/45527* (2013.01)

(58) Field of Classification Search
  None
  See application file for complete search history.

(56) References Cited

U.S. PATENT DOCUMENTS

| | | | |
|---|---|---|---|
| 2001/0054769 A1 | 12/2001 | Raaijmakers et al. | |
| 2006/0009034 A1* | 1/2006 | Lai | H01L 21/76843 257/E21.585 |
| 2013/0075912 A1* | 3/2013 | Wakatsuki | C23C 16/0272 257/763 |
| 2021/0104433 A1* | 4/2021 | Mukherjee | C23C 16/45531 |

FOREIGN PATENT DOCUMENTS

| | | |
|---|---|---|
| JP | 2016-145409 A | 8/2016 |
| KR | 10-2016-0006631 A | 1/2016 |
| KR | 10-2017-0133372 A | 12/2017 |
| KR | 10-2020-0026111 A | 3/2020 |

* cited by examiner

*Primary Examiner* — Francisco W Tschen
(74) *Attorney, Agent, or Firm* — Armstrong Teasdale LLP (57) ABSTRACT

A method includes: forming a titanium nitride base film containing silicon by alternately repeating: precipitation of titanium nitride by alternately and repeatedly supplying a titanium-containing gas, and supplying a nitriding gas to a substrate on which a recess is formed; and precipitation of silicon nitride by alternately and repeatedly supplying a silicon-containing gas, and supplying a nitriding gas to the substrate; and subsequently, forming a tungsten film so as to bury tungsten in the recess in which the titanium nitride base film is formed, by alternately and repeatedly supplying a raw material gas containing a tungsten raw material and a reaction gas reacting with the raw material gas, to the substrate. A supply flow rate of the silicon-containing gas is adjusted so that a content of the silicon in the titanium nitride base film is high on an opening side rather than on an inner side of the recess.

7 Claims, 9 Drawing Sheets

METHOD OF FORMING TUNGSTEN FILM AND SYSTEM THEREFOR

CROSS-REFERENCE TO RELATED APPLICATION

This application is based upon and claims the benefit of priority from Japanese Patent Application No. 2021-037737, filed on Mar. 9, 2021, the entire contents of which are incorporated herein by reference.

TECHNICAL FIELD

The present disclosure relates to a method of forming a tungsten film, and a system therefor.

BACKGROUND

In a semiconductor device, for example, in order to form a wiring on a substrate, a structure in which metal is buried in a recess may be formed. For example, a tungsten film is known as such a metal film.

Patent Document 1 discloses a technique for forming a barrier film such as a TiN film or a TiSiN film on the surface of an interlayer insulating film in which a recess such as a trench or a hole is formed, and forming a tungsten film on the surface of the barrier film.

PRIOR ART DOCUMENT

[Patent Document]
Patent Document 1: Japanese Laid-Open Patent Publication No. 2016-145409

SUMMARY

According to one embodiment of the present disclosure, there is provided a method of forming a tungsten film on a substrate, including: forming a titanium nitride base film containing silicon by alternately repeating: precipitation of titanium nitride by alternately and repeatedly supplying a titanium-containing gas, which is a metal raw material-containing gas containing a titanium raw material, and supplying a nitriding gas to the substrate on which a recess is formed; and precipitation of silicon nitride by alternately and repeatedly supplying a silicon-containing gas, which is a metal raw material-containing gas containing a silicon raw material, and supplying a nitriding gas to the substrate; and subsequently, forming a tungsten film so as to bury tungsten in the recess in which the titanium nitride base film is formed, by alternately and repeatedly supplying a raw material gas containing a tungsten raw material and a reaction gas, which reacts with the raw material gas to precipitate the tungsten, to the substrate, wherein a supply flow rate of the silicon-containing gas is adjusted so that a content of the silicon in the titanium nitride base film is high on an opening side of the recess rather than on an inner side of the recess.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

The present disclosure relates to a technique for burying tungsten in a recess formed in a surface of a semiconductor wafer, which is a substrate, by forming a tungsten film on the semiconductor wafer. An example of a method of forming the tungsten film according to the present disclosure will be described.

Figure 1:
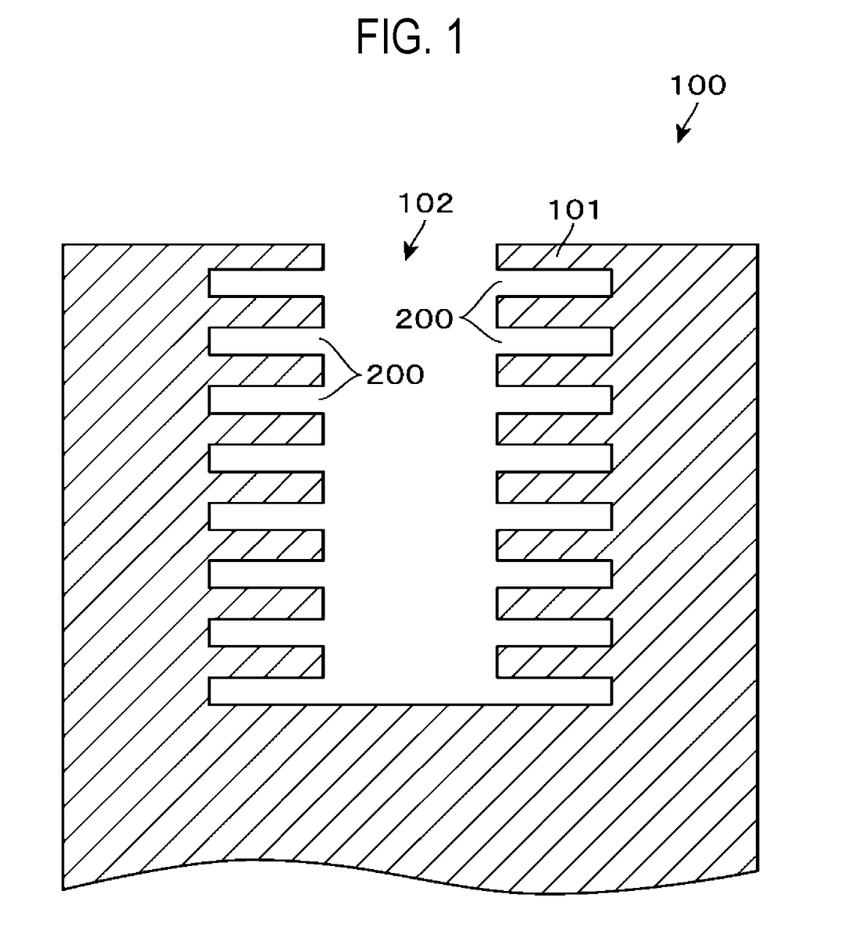
FIG. 1 is an enlarged longitudinal sectional view of a surface of a wafer to which a film forming method of the present disclosure is applied.

As shown in FIG. 1, in the semiconductor wafer (hereinafter referred to as a "wafer") 100 as a substrate, a vertical groove 102 is formed in, for example, a silicon oxide layer 101 formed on the surface of the wafer. Further, in the vertical groove 102, a plurality of horizontal grooves 200 are formed so as to be arranged in the thickness direction of the wafer 100. These horizontal grooves 200 each have an opening that opens on the sidewall surface of the vertical groove 102, and are formed as a recess extending horizontally from the opening. The width of the opening of each horizontal groove 200 is 30 nm or less, for example, 20 nm. Then, in the film forming method according to the present disclosure, tungsten is buried in these horizontal grooves 200 by forming a film on the surface of the wafer 100.

The structure of the wafer 100 is becoming more and more miniaturized. Therefore, even in the wafer 100 having the configuration illustrated in FIG. 1, it may be necessary to bury tungsten in the horizontal groove 200 having a larger aspect ratio and a longer depth than the width of the opening.

However, when a film is formed so as to bury tungsten in the horizontal groove 200 having a narrow opening, the tungsten film may be formed in the vicinity of the opening in advance, so that the opening may be blocked. As a result, a gap may remain in the horizontal groove 200, which may cause an increase in wiring resistance. The film forming method according to the present disclosure is to form a tungsten film while suppressing formation of a gap in the horizontal groove 200.

In the method of forming the tungsten film according to the present disclosure, a titanium nitride (TiN) film containing silicon (Si) (TiSiN film) is formed as a base film on the inner surface of the horizontal groove 200 by an ALD (Atomic Layer Deposition) method before burying tungsten in the horizontal groove 200.

Figure 2:
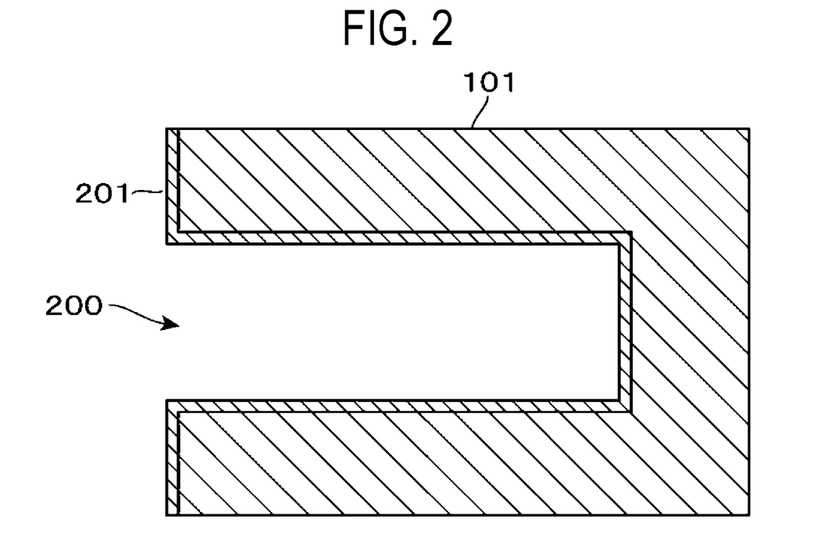
FIG. 2 is a first process diagram showing the film forming method of the present disclosure.

First, the wafer 100 shown in FIG. 1 is heated to 350 to 750 degrees C., and a titanium-containing gas (hereinafter, referred to as a "TiCl$_4$ gas"), which is a metal raw material-containing gas containing titanium tetrachloride (TiCl$_4$) which is a titanium raw material, is supplied to the wafer 100. As a result, the TiCl$_4$ gas is allowed to enter the horizontal groove 200 formed in the wafer 100 to adsorb TiCl$_4$ in the horizontal groove 200. Next, purging with a nitrogen (N$_2$) gas is performed to remove the residual TiCl$_4$ gas. Next, an ammonia (NH$_3$) gas, which is a nitriding gas, is supplied to the wafer 100 to nitride TiCl$_4$ adsorbed on the horizontal groove 200. As a result, TiCl$_4$ adsorbed on the horizontal groove 200 is nitrided to precipitate TiN on the surface of the horizontal groove 200. Subsequently, purging with a N$_2$ gas is performed to remove the NH$_3$ gas remaining in a process container 10. By alternately repeating the above-described cycle of precipitating TiN X times, for example, about 1 to 100 times, a TiN layer 201 is formed on the inner surface of the horizontal groove 200, as shown in FIG. 2. In the present disclosure, for example, even when the supply of the TiCl$_4$ gas and the supply of the NH$_3$ gas are carried out once, for the sake of convenience in expression, it may be expressed as "alternately and repeatedly supplied." (the same for supply of other gases).

Next, a silicon-containing gas (hereinafter, referred to as a "DCS gas"), which is a metal raw material-containing gas containing dichlorosilane (DCS) which is a silicon raw material, is supplied to the wafer 100 to adsorb DCS on the TiN layer 201. Next, purging with a N$_2$ gas is performed to remove the residual DCS gas. By controlling a supply amount and supply time of the DCS gas in the step of supplying the DCS gas, an adsorption amount of DCS molecules can be adjusted.

Figure 3:
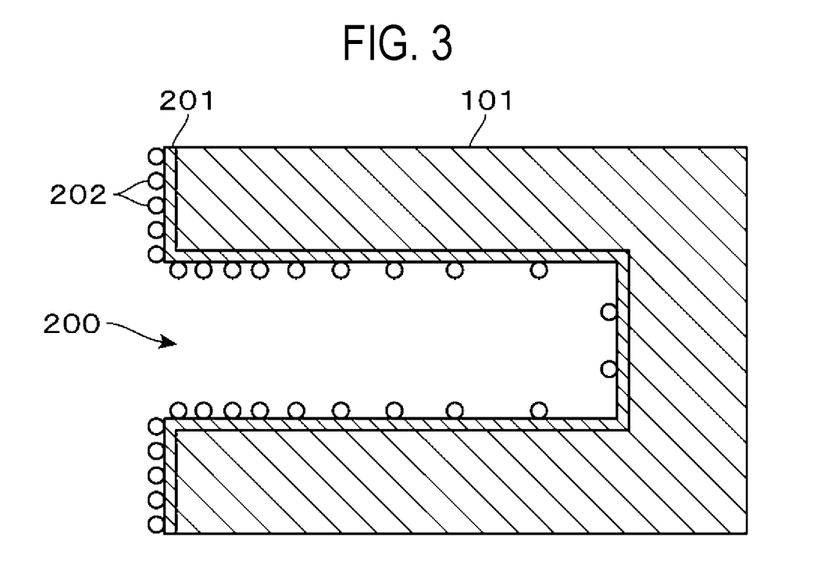
FIG. 3 is a second process diagram showing the film forming method of the present disclosure.
Figure 12:
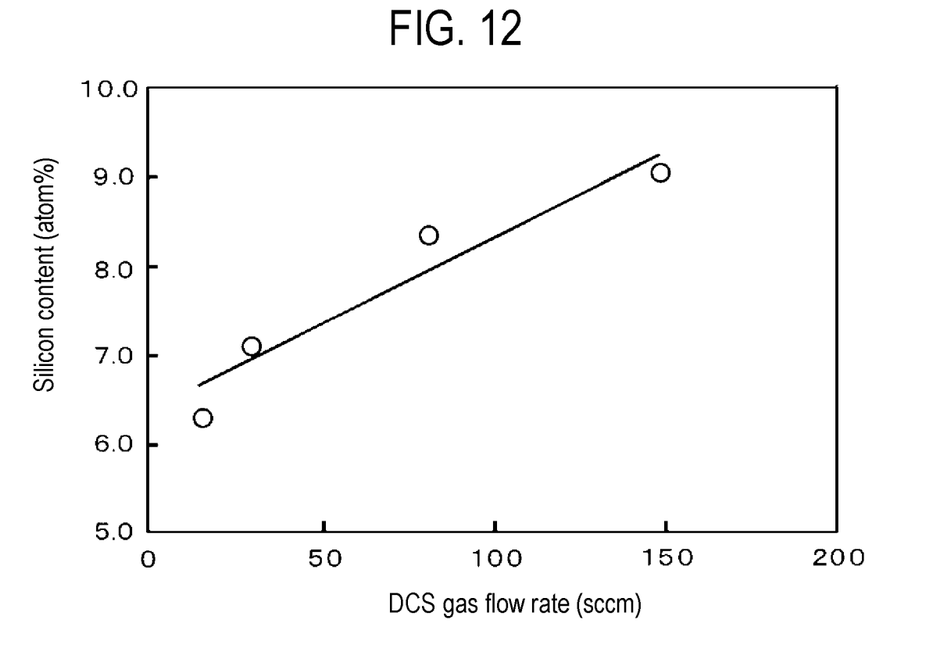
FIG. 12 is a graph showing a content of Si in a TiSiN film with respect to a flow rate of a silicon-containing gas.

In the horizontal groove 200 having the structure shown in FIG. 2, the DCS gas easily enters the opening, and the flow rate of DCS flowing through the opening tends to increase. On the other hand, it is difficult for the gas to enter the inner portion of the horizontal groove 200, and the flow rate of DCS flowing through the corresponding region tends to decrease. At this time, as shown in an evaluation test to be described later, there is a positive correlation between the flow rate of the DCS gas and the adsorption amount of the DCS molecules (FIG. 12). By utilizing this characteristic, as shown in FIG. 3, the density of molecules of DCS 202 adsorbed on the TiN layer 201 can be increased in the vicinity of the opening of the horizontal groove 200, while the adsorption density of molecules of the DCS 202 can be decreased on the inner side thereof.

Next, an NH$_3$ gas, which is a nitriding gas, is supplied to the wafer 100 to nitride DCS 202 adsorbed on the TiN layer 201. As a result, silicon nitride (SiN) is precipitated on the surface of the TiN layer 201. At this time, since the density of the DCS 202 adsorbed on the opening side of the horizontal groove 200 is high, a large amount of SiN is formed on the opening side of the horizontal groove 200, and a small amount of SiN is formed on the inner side thereof. By repeating the above-described cycle of forming SiN Y times, for example, 1 to 10 times, a desired amount of SiN is formed on the surface of the TiN layer 201.

Figure 4:
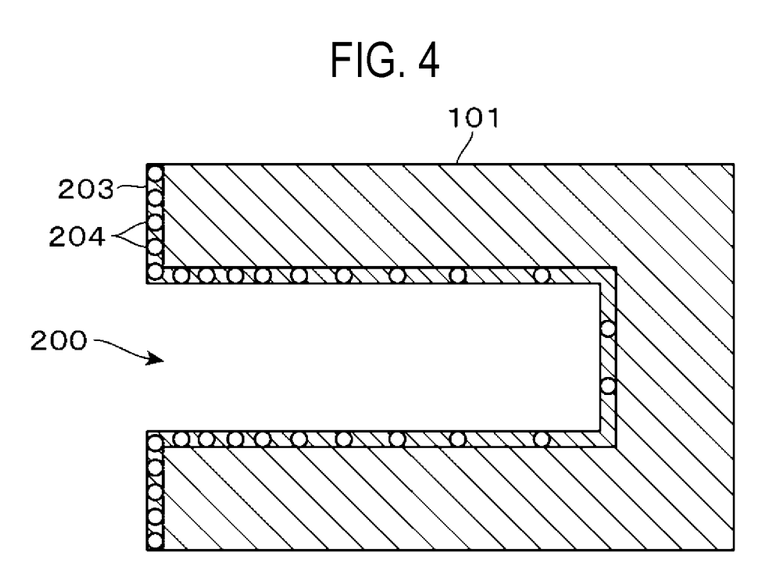
FIG. 4 is a third process diagram showing the film forming method of the present disclosure.

Then, when the above-mentioned precipitation of TiN and precipitation of SiN are alternately and repeatedly laminated, a titanium nitride base film (TiSiN film) 203 containing Si in the film can be formed. Then, as described above, SiN is precipitated so that Si 204 increases on the opening side of the horizontal groove 200 and Si decreases on the inner side thereof. As a result, as shown in FIG. 4, in the TiSiN film 203 formed in the horizontal groove 200, the content of Si 204 increases on the opening side of the horizontal groove 200, and the content of Si 204 decreases toward the inner side thereof. That is, the content of Si 204 on the opening side of the horizontal groove 200 is higher than that on the inner side thereof.

In FIGS. 3 to 7, in order to express the concentration distribution of Si in the TiSiN film 203, Si 204 is represented by a particle shape for the sake of convenience, but the size of Si 204 in these figures does not indicate the actual particle size of Si in the TiSiN film 203.

Subsequently, a tungsten film is formed on the surface of the TiSiN film 203 formed in the horizontal groove 200. In the film forming method according to the present disclosure, first, a nucleation layer composed of tungsten nuclei is formed on the surface of the TiSiN film 203 by an ALD method. The wafer 100 in which the TiSiN film 203 is formed in the horizontal groove 200 shown in FIG. 4 is heated to 150 to 450 degrees C., and a raw material gas (hereinafter, referred to as a "WF$_6$ gas") containing tungsten hexafluoride (WF$_6$) which is a tungsten raw material is supplied to the wafer 100. As a result, WF$_6$ is adsorbed on the surface of the TiSiN film 203. Next, a B$_2$H$_6$ (diborane) gas, which is a reducing gas composed of hydrogen and an element other than hydrogen, is supplied to the wafer 100. As a result, WF$_6$ adsorbed on the surface of the TiSiN film 203 is reduced to form an island-shaped tungsten layer. The above-described cycle of alternately repeating the adsorption of WF$_6$ on the wafer 100 and the supply of B$_2$H$_6$ gas to the wafer 100 is executed for three cycles in a range of, for example, 1 to 5 cycles. In the above-described cycle, the WF$_6$ gas corresponds to a raw material gas for nucleation and the B$_2$H$_6$ gas corresponds to a reaction gas for nucleation.

Figure 5:
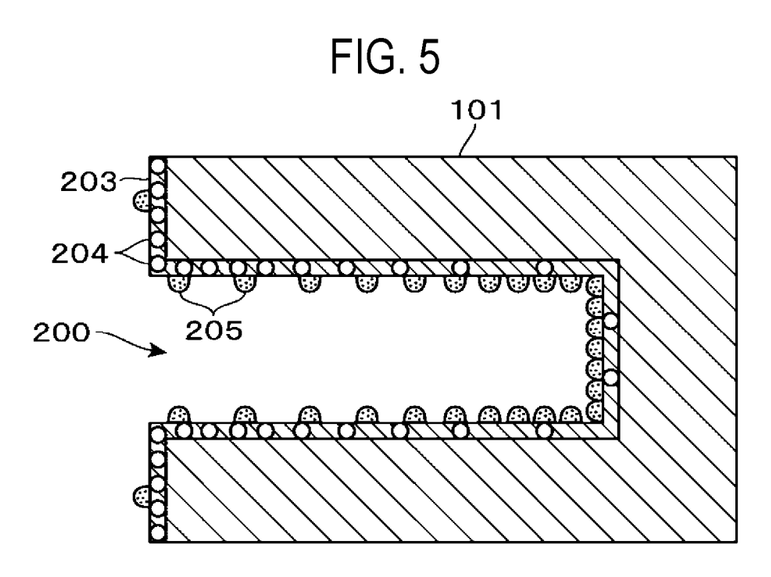
FIG. 5 is a fourth process diagram showing the film forming method of the present disclosure.

As a result, as shown in FIG. 5, a tungsten nucleation layer 205 is formed on the surface of the TiSiN film 203. As shown in a verification test to be described later, as the content of Si 204 in the TiSiN film 203 increases, the film thickness of the nucleation layer 205 formed on the TiSiN film 203 tends to decrease, that is, the nucleation layer 205 tends to be difficult to grow. Accordingly, as shown in FIG. 5, the amount of formation of the nucleation layer 205 decreases in the vicinity of the opening of the horizontal groove 200 having the high content of Si 204 in the TiSiN film 203. On the other hand, the amount of formation of the nucleation layer 205 increases on the inner side of the horizontal groove 200 having the low content of Si 204 in the TiSiN film 203. The nucleation layer 205 having an island shape shown in FIG. 5 is also represented by a particle shape for the sake of convenience in order to express the distribution of the amount of formation, but it does not indicate the actual size of the island of the nucleation layer 205.

Subsequently, a tungsten film 206 is formed by an ALD method. The wafer 100 is heated to 300 to 550 degrees C., and a raw material gas (hereinafter, referred to as a "WF$_6$ gas") containing WF$_6$, which is a tungsten raw material, is supplied to the wafer 100. As a result, the WF$_6$ gas enters into the horizontal groove 200, and is adsorbed on the surface of the nucleation layer 205. Next, a hydrogen (H$_2$) gas, which is a reaction gas, is supplied to the wafer 100 to reduce WF$_6$ adsorbed in the horizontal groove 200. As a result, tungsten is precipitated in the horizontal groove 200. The cycle of alternately repeating the adsorption of WF$_6$ to the wafer 100 and the supply of the H$_2$ gas to the wafer 100 is executed for, for example, 450 cycles within a range of 1 to 500 cycles. As a result, the tungsten film 206 is formed so as to be laminated on the nucleation layer 205.

As shown in the verification test to be described later, when the content of Si 204 in the TiSiN film 203 is small, the amount of formation of the nucleation layer 205 tends to increase, and the film thickness thereof also tends to increase. In a region where more nucleation layers 205 are formed, the film formation rate of the tungsten film 206 becomes higher. Therefore, the tungsten film 206 is likely to grow on the inner side of the horizontal groove 200, while the tungsten film 206 is relatively difficult to grow on the opening side.

Figure 6:
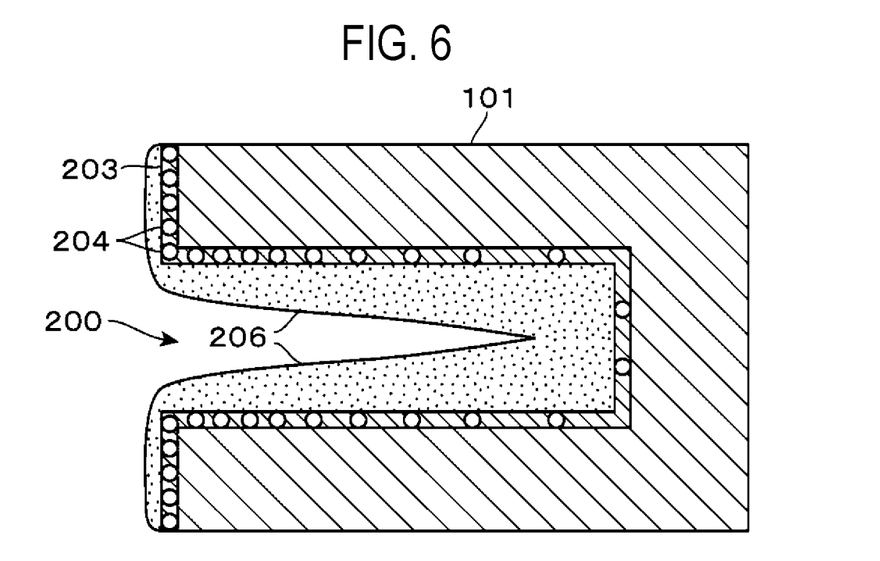
FIG. 6 is a fifth process diagram showing the film forming method of the present disclosure.
Figure 7:
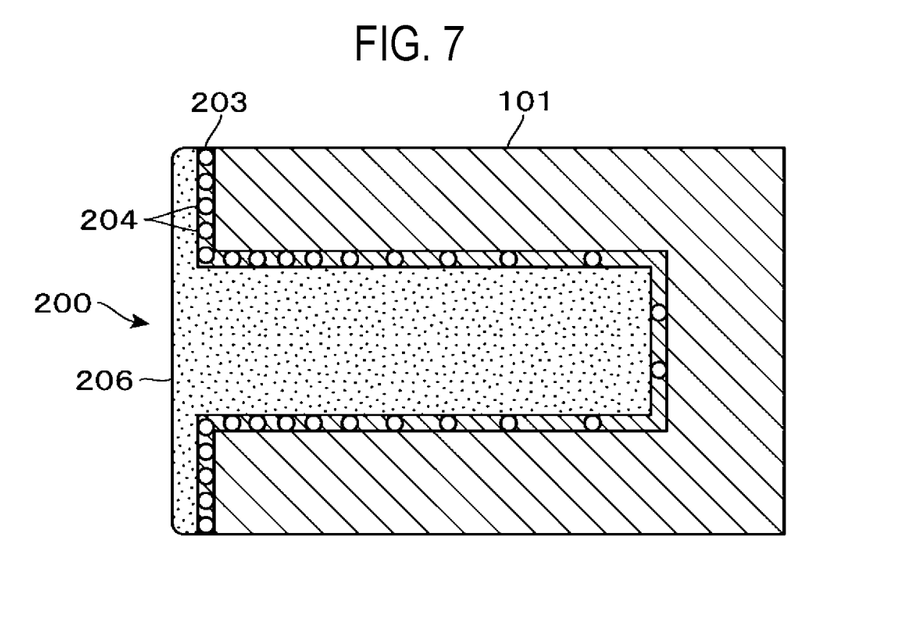
FIG. 7 is a sixth process diagram showing the film forming method of the present disclosure.

Accordingly, as shown in FIG. 6, the film thickness of the tungsten film 206 increases in advance on the inner side of the horizontal groove 200. As a result, it is possible to suppress the occurrence of a phenomenon in which the opening side of the horizontal groove 200 becomes thicker in advance to close the opening side. Accordingly, when the film formation of the tungsten film 206 is further continued, it is possible to bury tungsten so that a gap is less likely to remain in the horizontal groove 200, as shown in FIG. 7. In the case of the wafer 100 having the configuration shown in FIG. 1, tungsten is also buried in the vertical groove 102 in accordance with the burial of tungsten in the horizontal groove 200.

Further, as shown in the verification test to be described later, when the number of film formation cycles of the nucleation layer 205 is increased to increase the film thickness of the nucleation layer 205, a difference in film formation speed of the tungsten film 206 becomes smaller regardless of the content of Si 204 in the TiSiN film 203. Accordingly, the film thickness of the nucleation layer 205 is preferably 3 nm or less. In order to more reliably increase the difference in film formation rate of the tungsten film 206, the film thickness of the nucleation layer 205 is preferably less than 1 nm.

Further, as an example of the configuration of the horizontal groove 200, the aspect ratio (depth/opening diameter) may be exemplified in a range of 20 to 40. At this time, by supplying the DCS gas at a flow rate within a range of, for example, 1 to 200 sccm, it is considered that a sufficient difference in supply flow rate of the DCS gas between the opening and the inner portion of the horizontal groove 200 can be formed. As a result, it is possible to form the concentration distribution of Si in the TiSiN film 203 described with reference to FIGS. 3 to 7.

Here, a Ti-containing gas may be titanium tetrabromide (TiBr$_4$) or titanium tetrabromide (TiI$_4$). Further, it may be an organic titanium raw material such as TDMAT (tetrakisdimethylaminotitanium). A nitriding gas may be monomethylhydrazine (MMH). As a Si-containing gas, for example, HCD (disilicon hexachloride), SiH$_4$ (monosilane), or the like may be used.

A raw material gas for the nucleation layer 205 and the tungsten film 206 containing tungsten may be, for example, a tungsten hexachloride (WCl$_6$) gas. Further, a gas composed of hydrogen and an element other than hydrogen may be a SiH$_4$ (silane) gas or an NH$_3$ (ammonia) gas. Further, the recess may be a vertical groove having an opening formed on the surface of the wafer 100, or may be formed by film formation so as to bury tungsten in the vertical groove.

Figure 8:
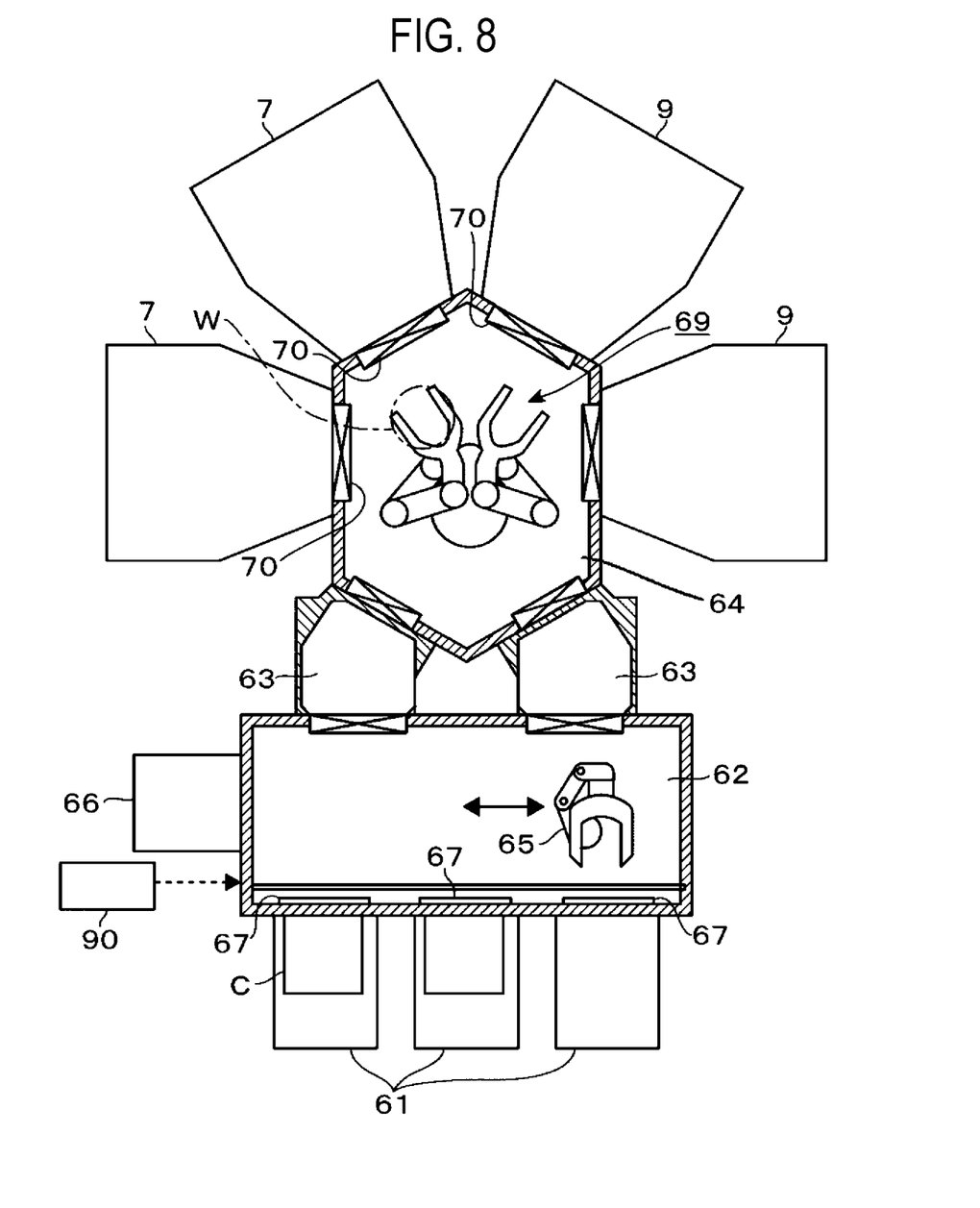
FIG. 8 is a plan view of a film forming system that executes the film forming method according to the present disclosure.

Subsequently, a configuration example of a substrate processing system for carrying out the above-described method of forming the tungsten film will be described. The substrate processing system is configured, for example, as a vacuum processing apparatus for a multi-chamber system. As shown in FIG. 8, the vacuum processing apparatus includes a horizontally long normal pressure transfer chamber 62 having a normal pressure atmosphere by, for example, a N$_2$ gas. For example, a load port 61 for delivering the wafer 100 with a transfer container C accommodating the wafer 100 is installed in front of the normal pressure transfer chamber 62. Reference numeral 67 in FIG. 8 denotes an opening/closing door provided on the front wall of the normal pressure transfer chamber 62. A transfer arm 65 for transferring the wafer 100 is provided inside the normal pressure transfer chamber 62. Further, an alignment chamber 66 for adjusting the direction and eccentricity of the wafer 100 is provided on the left wall of the normal pressure transfer chamber 62 when viewed from the load port 61.

For example, two load lock chambers 63 for switching the internal atmosphere thereof between the normal pressure atmosphere and the vacuum atmosphere while the wafer 100 is on standby are arranged side by side on the opposite side of the load port 61 in the normal pressure transfer chamber 62. A vacuum transfer chamber 64 is arranged on the inner side of the load lock chambers 63 when viewed from the normal pressure transfer chamber 62. The load lock chambers 63 are connected to the vacuum transfer chamber 64 via their respective gate valves 70.

Further, the vacuum transfer chamber 64 is provided with a TiSiN film forming apparatus 7 for forming the TiSiN film 203 as a base film on the wafer 100. Further, the vacuum transfer chamber 64 includes a nucleation layer forming apparatus 8 for forming the nucleation layer 205 on the surface of the TiSiN film 203 and a tungsten film forming apparatus 9 for forming the tungsten film 206 to bury tungsten in the horizontal groove 200. In this example, the TiSiN film forming apparatus 7 and the nucleation layer forming apparatus 8 are connected to the vacuum transfer chamber 64 one by one, and two tungsten film forming apparatus 9 are connected to the vacuum transfer chamber 64. The vacuum transfer chamber 64 is provided with a transfer arm 69. The wafer 100 is delivered by the transfer arm 69 between each load lock chamber 63, the TiSiN film forming apparatus 7, the nucleation layer forming apparatus 8, and the tungsten film forming apparatus 9.

The vacuum processing apparatus is provided with a controller 90 composed of, for example, a computer. The controller 90 includes a data processing part constituted with a program, a memory, and a CPU. An instruction (each step) to send a control signal from the controller 90 to each part of the vacuum processing apparatus to proceed with each step of performing film formation, for example, the TiSiN film 203, the nucleation layer 205, and the tungsten film 206 is built in the program. This program is stored in a storage part such as a computer storage medium, for example, a flexible disk, a compact disc, a hard disk, or a MO (magneto-optical disc), and is installed on the controller 90.

Figure 9:
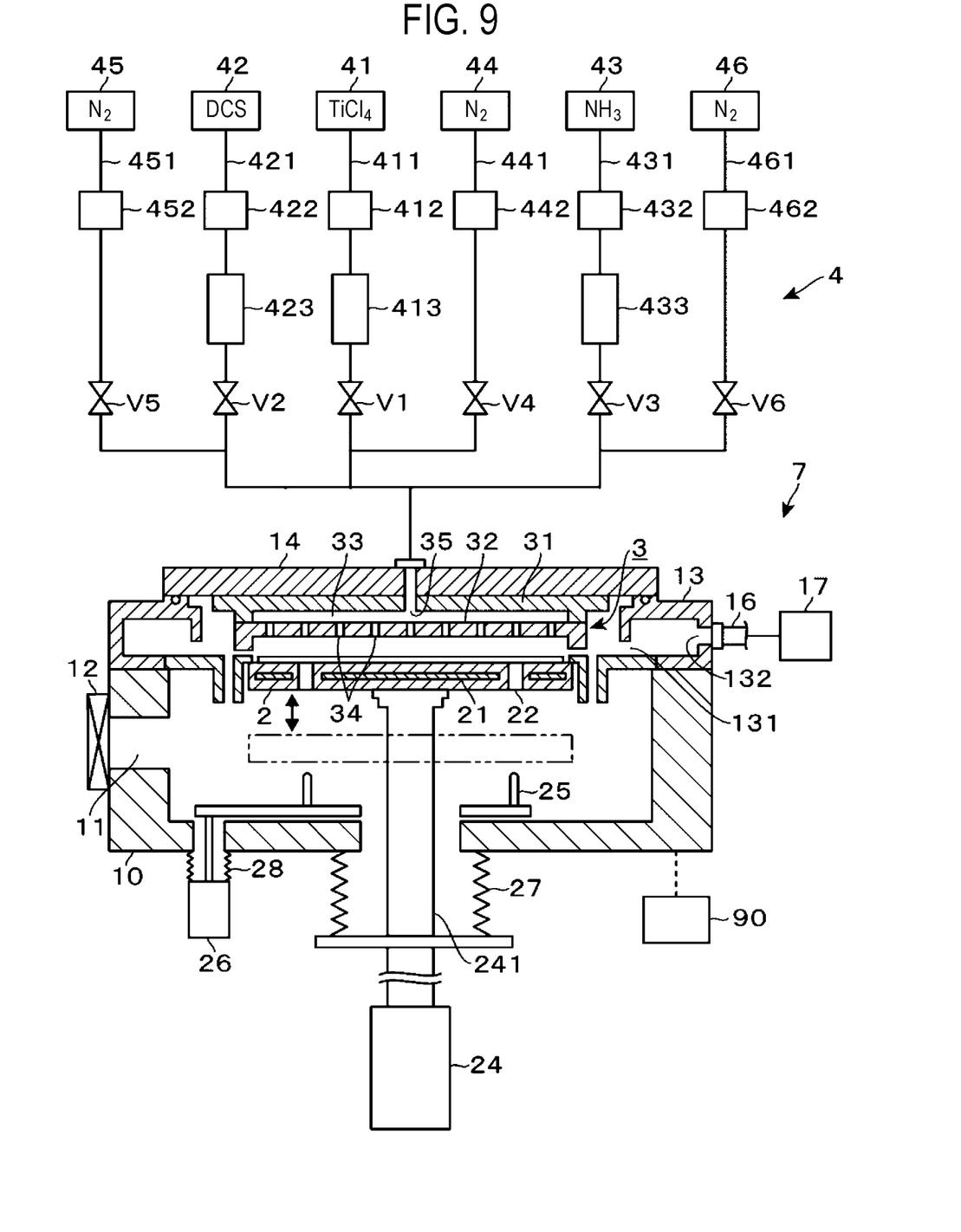
FIG. 9 is a longitudinal sectional side view of a TiSiN film forming apparatus provided in the film forming system.

Subsequently, the TiSiN film forming apparatus 7 will be described with reference to FIG. 9. The TiSiN film forming apparatus 7 is provided with the process container 10 for accommodating the wafer 100, and a loading/unloading port 11 for loading/unloading the wafer 100 is formed on the sidewall of the process container 10 so as to be able to opened/closed by a gate valve 12. At the upper portion of the sidewall of the process container 10, for example, a slit 131 is formed along the inner peripheral surface and an annular exhaust duct 13 having an exhaust port 132 formed on an outer wall is arranged. A ceiling wall 14 is provided on the upper surface of the exhaust duct 13 so as to close an upper opening of the process container 10. The process container 10 is connected to a vacuum exhaust part 17, which is composed of, for example, a vacuum pump, by a vacuum exhaust passage 16 via the exhaust port 132, and an internal pressure of the process container 10 is controlled by a pressure adjusting part (not shown).

A stage 2 for horizontally supporting the wafer 100 is provided inside the process container 10, and a heater 21 for heating the wafer 100 is buried in the stage 2. The stage 2 is configured to be able to move up and down between a processing position (shown by a solid line in FIG. 9) and a delivery position (shown by a two-dot chain line in FIG. 9) of the wafer 100 below the processing position by an elevating mechanism 24 via a support member 241. Three support pins 25 (only two are shown) for delivering the wafer 100 are provided below the stage 2 inside the process container 10. These support pins 25 are provided so as to move up and down by an elevating mechanism 26 so as to protrude from the upper surface of the stage 2 at the delivery position. In the figure, reference numeral 22 denotes through-holes for the support pins 25, and reference numerals 27 and 28 denote bellows that separate the internal atmosphere of the process container 10 from the outside air and expand/contract as the stage 2 and the support pins 25 move up and down, respectively.

The process container 10 is provided with a shower head 3 for supplying a process gas in the form of a shower into the process container 10 so as to face the stage 2. The shower head 3 includes a main body portion 31 fixed to the ceiling wall 14 of the process container 10, and a shower plate 32 connected under the main body portion 31, and the inside thereof forms a gas diffusion space 33. Gas discharge holes 34 are formed in the shower plate 32, and a gas supply system 4 is connected to the gas diffusion space 33 via a gas introduction hole 35.

The gas supply system 4 includes a first gas supplier for supplying a titanium tetrachloride (TiCl$_4$) gas and a second gas supplier for supplying a dichlorosilane (SiH$_2$Cl$_2$: DCS) gas. Further, the gas supply system 4 includes a nitriding gas supplier for supplying a nitriding gas. In this example, an ammonia (NH$_3$) gas is used as the nitriding gas.

The first gas supplier includes a TiCl$_4$ source 41 and a TiCl$_4$ supply path 411. For example, a flow rate adjusting part 412, a storage tank 413, and a valve V1 are provided in the TiCl$_4$ gas supply path 411 from the upstream side. The second gas supplier includes a DCS source 42 and a DCS supply path 421. For example, a flow rate adjusting part 422, a storage tank 423, and a valve V2 are provided in the DCS gas supply path 421 from the upstream side.

Further, the nitriding gas supplier includes an NH$_3$ source 43 and an NH$_3$ supply path 431. For example, a flow rate adjusting part 432, a storage tank 433, and a valve V3 is provided in the NH$_3$ gas supply path 431 from the upstream side.

These TiCl$_4$ gas, DCS gas, and NH$_3$ gas are temporarily stored in the storage tanks 413, 423, and 433, respectively, are boosted to a predetermined pressure in respective storage tanks 413, 423, and 433, and then are supplied into the process container 10. The supply and cutoff of each gas from the storage tanks 413, 423, and 433 to the process container 10 is performed by opening/closing the valves V1, V2, and V3.

Further, the gas supply system 4 includes sources 44, 45, and 46 of an inert gas, for example, a nitrogen (N$_2$) gas. In this example, the N$_2$ gas supplied from the source 44 is a purge gas for TiCl$_4$, and the source 44 is connected to the downstream side of the valve V1 in the gas supply path 411 of the TiCl$_4$ gas via a purge gas supply path 441. Further, the N$_2$ gas supplied from the source 45 is a purge gas for DCS, and the source 45 is connected to the downstream side of the valve V2 in the gas supply path 421 of the DCS gas via a purge gas supply path 451. Further, the N$_2$ gas supplied from the source 46 is a purge gas for NH$_3$, and the source 46 is connected to the downstream side of the valve V3 in the gas supply path 431 of the NH$_3$ gas via a purge gas supply path 461. In FIG. 1, reference numerals 442, 452, and 462 each denote a flow rate adjusting part, and reference numerals V4, V5, and V6 each denote to a valve.

Further, the nucleation layer forming apparatus 8 and the tungsten film forming apparatus 9 are substantially identical in configuration to the TiSiN film forming apparatus 7 except that a gas supplied to the wafer 100 is different and the heating temperature of the wafer 100 is different.

The nucleation layer forming apparatus 8 is configured to include the gas supply system 4 for supplying a WF$_6$ gas together with a purge gas into the process container 10, and also includes the gas supply system 4 for supplying a B$_2$H$_6$ gas together with a purge gas. Further, the stage 2 is configured to heat the wafer 100.

Further, the tungsten film forming apparatus 9 includes the gas supply system 4 for supplying a WF$_6$ gas together with a purge gas into the process container 10, and also includes the gas supply system 4 for supplying a H$_2$ gas together with a purge gas. Further, the stage 2 is configured to heat the wafer 100.

In such a vacuum processing apparatus, the transfer container C containing the wafer 100 having, for example, the surface structure shown in FIG. 1, is loaded into the load port 61 of the vacuum processing apparatus. Further, the wafer 100 is taken out from the transfer container C and is loaded into the alignment chamber 66 via the normal pressure transfer chamber 62. After alignment is performed in the alignment chamber 66, the wafer 100 is transferred to the vacuum transfer chamber 64 via the load lock chamber 63. Subsequently, the wafer is transferred to the TiSiN film forming apparatus 7 by the transfer arm 69, in which a process of forming the TiSiN film 203 is performed by the above-mentioned ALD method. After that, the wafer 100 is taken out by the transfer arm 69 and is transferred to the nucleation layer forming apparatus 8 in which a process of forming the nucleation layer 205 is performed by the ALD method. Next, the wafer 100 is taken out by the transfer arm 69 and is transferred to the tungsten film forming apparatus 9 in which a process of forming the tungsten film 206 is performed by the ALD method.

In this way, the wafer 100 in which the tungsten film 206 is buried in the horizontal groove 200 is transferred to the load lock chamber 63 in a vacuum atmosphere by the second transfer arm 69. Next, after switching the load lock chamber 63 to the air atmosphere, the wafer 100 is returned to, for example, the original transfer container C by the transfer arm 65.

Here, the configuration of the vacuum processing apparatus is not limited to the example shown in FIG. 1. For example, the nucleation layer forming apparatus 8 and the tungsten film forming apparatus 9 may be shared. In this case, the wafer 100 on which the TiSiN film 203 is formed is loaded into the tungsten film forming apparatus, and the wafer 100 is heated to form the nucleation layer 205. Next, while raising the temperature of the stage 2 to heat the wafer 100, the tungsten film 206 may be formed on the wafer 100. However, as described above, the nucleation layer 205 and the tungsten film 206 have different heating temperatures of the wafer 100 when forming a film. Therefore, by using the nucleation layer forming apparatus 8 and the tungsten film forming apparatus 9 as separate apparatuses, the time required for adjusting the temperature of the stage 2 can be reduced.

It should be noted that the embodiments disclosed herein are exemplary in all respects and are not restrictive. The above-described embodiments may be omitted, replaced or modified in various forms without departing from the scope and spirit of the appended claims.

[Verification Test 1]

The following tests were conducted to verify the effects of the method of forming the tungsten film according to the present disclosure.

[TiSiN Film 1]

Test 1 was an example in which the TiSiN film 203, the nucleation layer 205, and the tungsten film 206 are stacked in this order on a test wafer 100 in which a recess is not formed, according to the method of forming the tungsten film shown in the embodiment using the vacuum processing apparatus shown in FIG. 8. In the film formation of the TiSiN film 203, the ratio of the number of cycles X for forming the TiN layer 201 to the number of cycles Y for forming SiN was X:Y=1:1.

[TiSiN Film 2]

TiSiN film 2 (Test 2) was an example in which the same process as the TiSiN film 1 was performed except that X:Y=5:1 was set in the film formation of the TiSiN film 203.

[TiN Film 3]

TiN film 3 (Test 3) was an example in which the same process as the TiSiN film 2 was performed except that SiN was not formed in the step of forming the TiSiN film, that is, only the TiN layer 201 was formed.

For each of TiSiN films 1 and 2 and TiN film 3, the number of cycles at the time of forming the nucleation layer 205 was set to 5, 10, and 15 times, and the thickness of the formed nucleation layer 205 was measured. At this time, for Tests 1 to 3, changes in the thickness of the nucleation layer 205 with respect to the number of cycles at the time of forming the nucleation layer 205 are shown in FIG. 10.

Further, for TiSiN films 1, 2 and TiN film 3, the number of cycles at the time of forming the nucleation layer 205 was set to 2, 3, 4, 6, 8, and 10 times, and the sum of film thickness (total film thickness) of the nucleation layer and the tungsten film when the tungsten film 206 was further formed in the same manner as in the embodiment was measured. For the TiSiN films 1 and 2 and the TiN film 3, changes in the total film thickness of tungsten with respect to the number of cycles at the time of forming the nucleation layer 205 are shown in FIG. 11.

Figure 10:
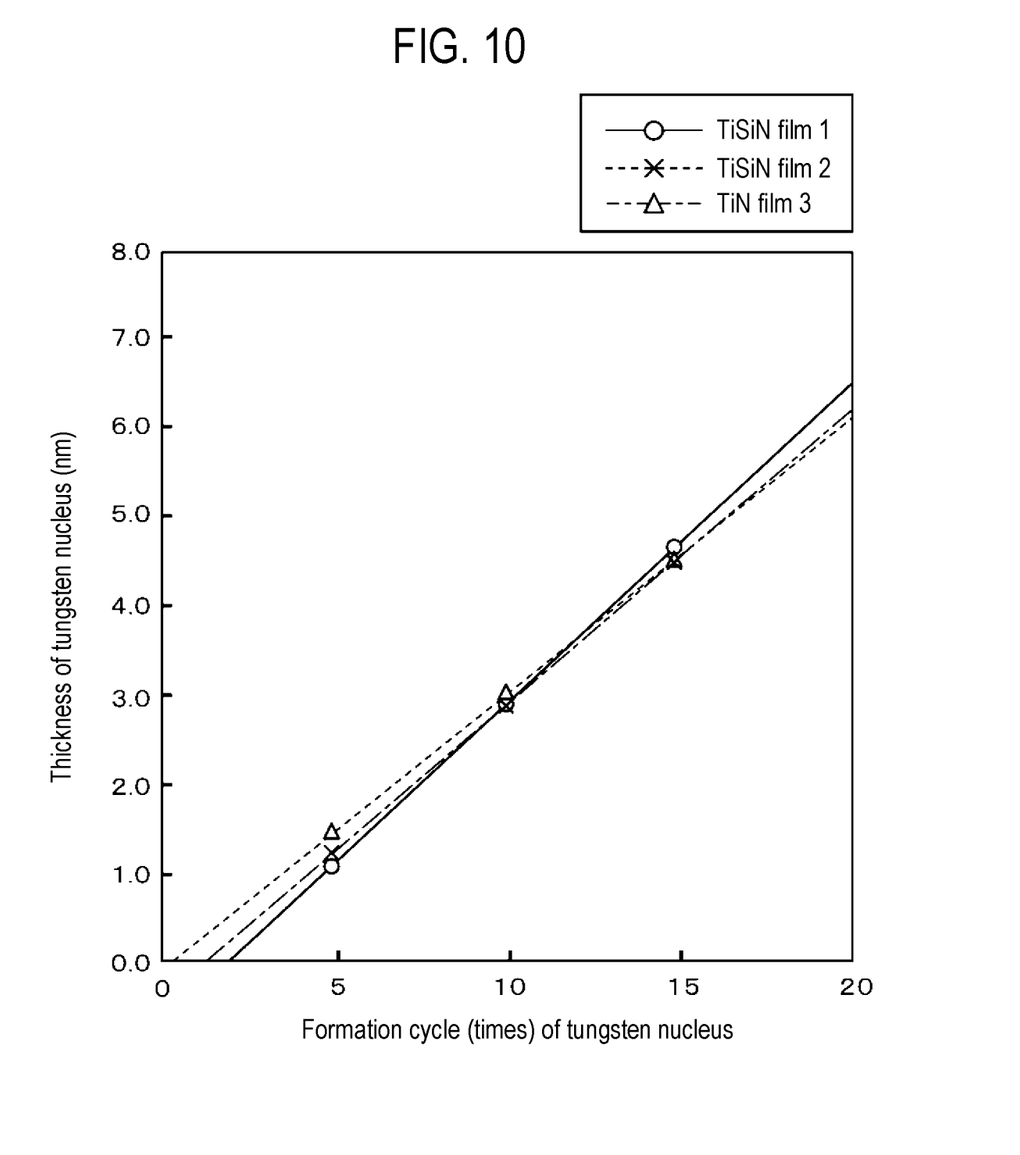
FIG. 10 is a graph showing a change in thickness of tungsten nuclei with respect to the number of raw material gas supply cycles.

As shown in FIG. 10, when the number of cycles in the film formation of the nucleation layer 205 is about 15 times, there is almost no difference in the film thickness of the nucleation layer 205 between the TiSiN films 1 and 2 and the TiN film 3. However, when the number of cycles is 5 times, it can be seen that the film thickness of the nucleation layer 205 in Test 1 is thin.

Figure 11:
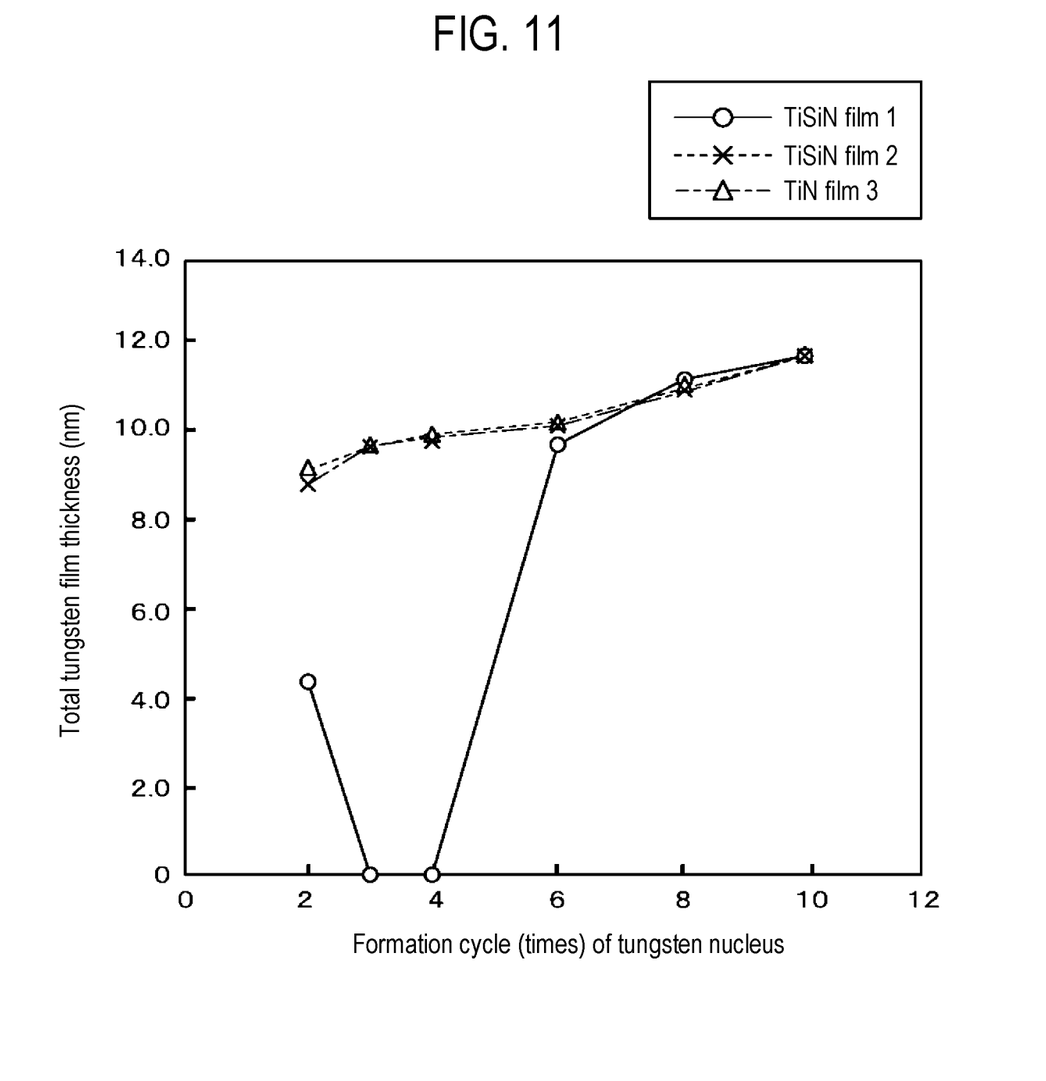
FIG. 11 is a graph showing changes in film thickness of a tungsten film with respect to the number of raw material gas supply cycles.

Further, as shown in FIG. 11, by setting the number of cycles at the time of forming the nucleation layer 205 to 6 or less, it can be seen that the nucleation layer 205 and the tungsten film 206 of TiSiN film 1 are hardly formed.

Accordingly, it can be said that the film formation rate of the tungsten film 206 can be adjusted by forming an appropriate amount of nucleation layer 205 while changing the content of Si contained in the TiSiN film 203 which is a base film.

[Verification Test 2]

Further, the TiSiN film 203 was formed with the flow rate of DCS gas set to 20, 30, 80, and 150 sccm for a test wafer 100 in which a recess is not formed, and the content of Si in the TiSiN film 203 was measured. A graph of the content of Si in the TiSiN film 203 with respect to the flow rate of DCS gas is shown in FIG. 12.

As shown in FIG. 12, it can be seen that the Si content increases as the flow rate of DCS gas increases. Accordingly, even in the recess formed in the wafer 100, by forming a difference in the supply flow rate of DCS gas between the opening and the inner side of the recess, it can be said that a difference in the content of Si in the TiSiN film 203 can be formed between the opening and the inner side of the recess.

According to the present disclosure in some embodiments, it is possible to form a tungsten film while suppressing formation of a gap in a recess.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a tungsten film, comprising:
  preparing a substrate, which includes a vertical groove formed on a surface of the substrate and horizontal grooves formed in the vertical groove and arranged in a thickness direction of the substrate, wherein each of the horizontal grooves has an opening formed on a sidewall of the vertical groove and is formed as a recess extending horizontally from the opening;
  forming a titanium nitride base film containing silicon in the recess of each of the horizontal grooves by alternately repeating:
    precipitation of titanium nitride by alternately and repeatedly supplying a titanium-containing gas, which is a metal raw material-containing gas containing a titanium raw material, and supplying a nitriding gas to the substrate; and
    precipitation of silicon nitride by alternately and repeatedly supplying a silicon-containing gas, which is a metal raw material-containing gas containing a silicon raw material, and supplying a nitriding gas to the substrate; and
  subsequently, forming a tungsten film so as to bury tungsten in the recess of the each of the horizontal grooves, by alternately and repeatedly supplying a raw material gas containing a tungsten raw material and a reaction gas, which reacts with the raw material gas to precipitate the tungsten, to the substrate, wherein a supply flow rate of the silicon-containing gas is adjusted so that a content of the silicon in the titanium nitride base film is high on an opening side of the recess rather than on an inner side of the recess.

2. The method of claim 1, further comprising: between the forming the titanium nitride base film and the forming the tungsten film, forming a tungsten nucleation layer on a surface of the titanium nitride base film by alternately and repeatedly supplying, to the substrate, a nucleation raw material gas containing a tungsten raw material and a nucleation reaction gas, which reacts with the nucleation raw material gas to precipitate tungsten which becomes a nucleus when forming the tungsten film.

3. The method of claim 2, wherein the nucleus of the tungsten is formed to have a thickness of 3 nm or less.

4. The method of claim 3, wherein the recess has an opening having a width of 30 nm or less.

5. The method of claim 4, wherein the silicon-containing gas is dichlorosilane.

6. The method of claim 1, wherein the recess has an opening having a width of 30 nm or less.

7. The method of claim 1, wherein the silicon-containing gas is dichlorosilane.

* * * * *